(12) United States Patent
Dale et al.

(10) Patent No.: US 8,368,422 B1
(45) Date of Patent: Feb. 5, 2013

(54) SYSTEM AND METHOD FOR TESTING OFF-CHIP DRIVER IMPEDANCE

(75) Inventors: Bret Roberts Dale, Jericho, VT (US); Oliver Kiehl, Charlotte, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/463,832

(22) Filed: May 4, 2012

(51) Int. Cl.
*H03K 19/00* (2006.01)
(52) U.S. Cl. .......................... 326/16; 324/73.1; 714/727
(58) Field of Classification Search ............... 326/16; 324/73.1; 714/724–727, 729
See application file for complete search history.

(56) References Cited

U.S. PATENT DOCUMENTS

| | | | | |
|---|---|---|---|---|
| 7,036,061 | B2* | 4/2006 | Muhtaroglu | 714/727 |
| 7,446,553 | B2* | 11/2008 | Cano et al. | 324/762.01 |
| 7,453,282 | B2* | 11/2008 | Arnold et al. | 326/16 |

* cited by examiner

*Primary Examiner* — James H Cho
(74) *Attorney, Agent, or Firm* — Winston Hsu; Scott Margo

(57) ABSTRACT

A testing circuit for verifying the impedance of off-chip drivers includes: a plurality of off-chip drivers (OCD), each off-chip driver including a through-silicon via (TSV); an IREF test pad, for driving a current to the plurality of off-chip drivers; a plurality of pre-drivers, each respective pre-driver coupled to one of the plurality of off-chip drivers, wherein the plurality of pre-drivers are configured to turn on the off-chip drivers; a VREF test pad, for inputting a reference voltage to the testing circuit; a plurality of input buffers (IB) for outputting a plurality of comparison results, each of the plurality of input buffers configured to output the plurality of comparison results according to the reference voltage and the voltage at the TSV nodes; and a test pad, coupled to the plurality of IBs, for receiving the comparison results to determine whether the impedance of each OCD is within a desired range.

13 Claims, 3 Drawing Sheets

SYSTEM AND METHOD FOR TESTING OFF-CHIP DRIVER IMPEDANCE

BACKGROUND

The present application relates to off-chip drivers, and more particularly, to systems and methods for testing the impedance of off-chip drivers that use through-silicon vias.

DESCRIPTION OF THE PRIOR ART

Semiconductor devices function at specific operating voltages. As technology transitions to the sub-micron scale and operates more and more in "low power" ranges, the precision of operating voltages becomes particularly important to chip designers. Off-chip drivers (OCDs) are commonly used to generate the aforementioned operating voltages for semiconductor devices (or more generally speaking, chips). Traditionally, the off-chip interconnect is achieved through bond wires attaching to bond pads on the chip. With the development of flip-chip technology and wafer stacking, among other things, the driver-chip interface has become more complicated, necessitating more complicated bonding techniques. As of recently, an even bigger challenge facing designers is the replacement of standard bond pads with through-silicon vias (TSVs), which are often used to facilitate low power operations where impedance and capacitance considerations are of particular importance.

FIG. 1 shows a diagram of a conventional off-chip driver (OCD) circuit 100 according to a conventional prior art embodiment. As shown in the diagram, the OCD circuit 100 comprises a pull-up driver (PU) 103 consisting of a PFET coupled to VCC and a pull-down driver (PD) 105 consisting of an NFET coupled in series between the pull-up driver 103 and ground. An output voltage is output from a node between the PFET 103 and NFET 105, and coupled to a through-silicon via (TSV) 118, which is also coupled to an input buffer (IB) 128.

In the circuit 100 shown in FIG. 1, the capacitance at the node coupling the input buffer 128 to the TSV 118 is typically relatively low: for example, about 0.5 pF. Manufacturers often probe the OCD of a given circuit, such as, for example, circuit 100, in order to test for various properties such as impedance. However, as the TSV diameter decreases and the pitch becomes tighter, probing the TSV 118 becomes more difficult. In addition, testing an OCD by attaching a test pad directly to the TSV 118 can cause problems; for example, the test pad can introduce a relatively large metal capacitance to the OCD circuit (e.g. circuit 100).

SUMMARY

The present application discloses a method and apparatus for, among other things, testing the impedance of at least one OCD having through-silicon vias, wherein the method and apparatus preferably do not introduce large capacitances to the system.

A testing circuit according to an exemplary embodiment of the present application includes a plurality of off-chip drivers (OCD), each off-chip driver including a pull-up driver coupled to a power supply; a pull-down driver coupled between the pull-up driver and ground; and a through silicon via (TSV) coupled between the pull-up driver and the pull down driver. The testing circuit also includes a plurality of pre-drivers, each respective pre-driver coupled to one of the plurality of off-chip drivers; an IREF test pad coupled to the plurality of pre-drivers; a plurality of input buffers (IB), each of the plurality of input buffers comprising a positive input and a negative input, wherein the positive input of each of the plurality of input buffers is coupled to one of the plurality of off-chip drivers through the through-silicon via of each respective off-chip driver; a VREF test pad coupled to the negative input of each of the plurality of input buffers; and a scan out test pad, coupled to the plurality of input buffers.

A method for verifying an impedance of a plurality of off-chip drivers according to an exemplary embodiment of the present application includes: driving a current to the plurality of off-chip drivers, wherein each off-chip driver includes a pull-up driver coupled to a power supply; a pull-down driver coupled between the pull-up driver and ground; and a through-silicon via (TSV) coupled between the pull-up driver and the pull down driver. The method also includes turning on the plurality of off-chip drivers, wherein each respective off-chip driver is coupled to at least one of a plurality of pre-drivers, and further wherein turning on the plurality of off-chip drivers creates a voltage drop at each TSV; and receiving a reference voltage at a plurality if input buffers (IB). Each of the plurality of input buffers includes a plurality of inputs, and each of the plurality of input buffers is configured to compare the plurality of inputs and output a comparison result. The method also includes the step of comparing, in each of the plurality of input buffers, the reference voltage and the voltage at the TSV of one of the off-chip drivers; and verifying the impedance of each of the plurality of OCDs using the comparison result of each of the plurality of input buffers to determine whether the impedance of each OCD is within a desired range.

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that various changes may be made without departing from the spirit and scope of the present invention. The following detailed description is, therefore, not to be taken in a limiting sense.

DETAILED DESCRIPTION

The present application discloses a testing circuit and method that introduce relatively insignificant capacitance values to a system when measuring the impedance of an off-chip driver coupled to a through-silicon via (TSV). In some embodiments, an off-chip driver (OCD) comparison test utilizes input buffers rather than directly attaching a test pad to the TSVs. In some cases, minimal circuitry is added to the OCD circuit to perform the OCD comparison test, or to test a plurality of OCDs concurrently.

Figure 1:
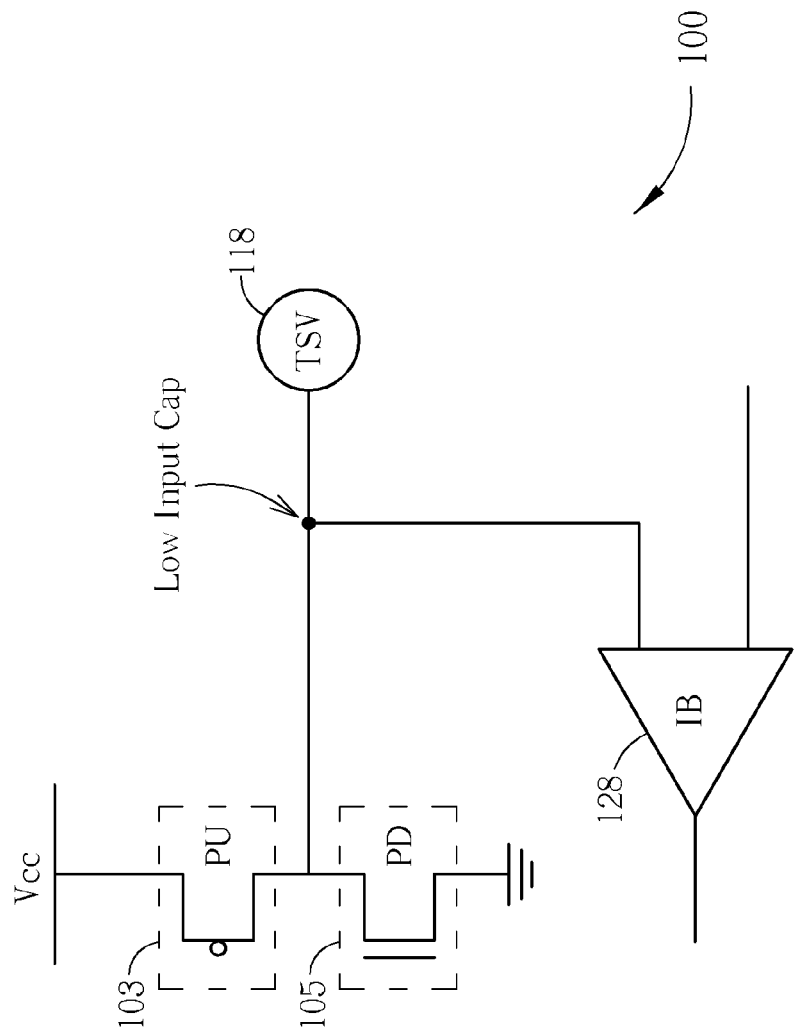
FIG. 1 is a diagram of a conventional off-chip driver comprising a through-silicon via.
Figure 2:
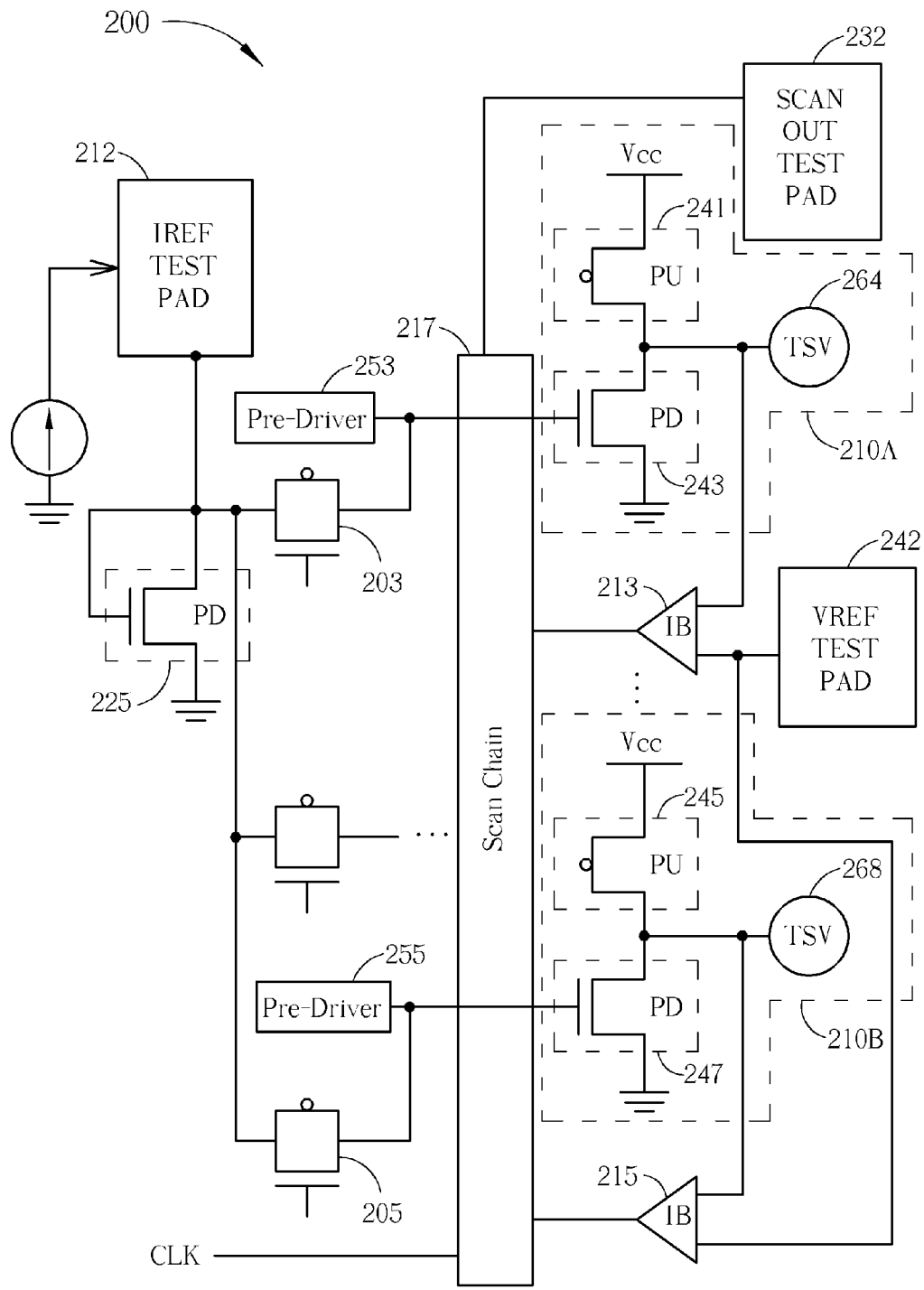
FIG. 2 is a diagram of an off-chip driver comprising through-silicon vias according to an embodiment of the present application.

FIG. 2 illustrates an exemplary embodiment of a testing circuit 200 according to the present application. In the illustrated embodiment, the testing circuit 200 includes a plurality of off-chip drivers (OCDs) 210A and 210B. A first OCD 210A comprises a first pull-up driver (PU) (referred to interchangeably in this application as a PFET) 241 and a first pull-down driver (PD) (referred to interchangeably in this application as an NFET) 243. A second OCD 210B comprises a second pull-up driver (PU) 245 and a second pull-down driver (PD) 247. While the testing circuit 200, as illustrated in FIG. 2, includes two OCDs 210A and 210B, it would be readily apparent to one skilled in the art that a testing circuit 200 may include any desired number of OCDs. In FIG. 2, each OCD is illustrated as having a corresponding pre-driver 253 and 255, and the output voltage node of each OCD is coupled to a through-silicon via (TSV) 264 and 268. The output voltage nodes are also coupled to the positive input of a corresponding Test Input Buffer (IB) 213 and 215, and the negative inputs of the Test IBs 213 and 215 are coupled to a VREF test pad 242.

In FIG. 2, pass gates 203 and 205 are each respectively coupled to the first and second OCDs 210A and 210B, such that each pass gate 203 and 205 is coupled to the pre-driver 253 and 255, respectively, of the first and second OCD 210A and 210B. As discussed above, while only two pass gates 203 and 205 are illustrated in detail, one skilled in the art can easily modify the circuit diagram in FIG. 2 after reading the detailed description to incorporate as many pass gates as there are OCDs. In operation, an IREF test pad 212 and a pull-down driver (PD) 225 that mimics the operation of the NFETS 243 and 247 transmit a current I to the input of each pass gate 203 and 205. The pull-down (PD) driver 225 forces a current I through the IREF test pad 212, and the forced current is then mirrored, via the pass gates 203 and 205, to the respective OCDs 210A and 210B.

Each Test IB 213 and 215 has an output that is coupled to a scan chain 217, which is clocked by a clock signal CLK. Based on the signals present on the positive and negative inputs of the Test IBs 213 and 215, each Test IB 213 and 215 outputs a comparison result to the scan chain 217. The scan chain 217, in turn, outputs the comparison results to a Scan out test pad 232, which is configured to output the results for analysis.

In operation, initially the testing circuit 200 may be configured such that all pre-drivers 253 and 255 are in a high impedance or High-Z state, wherein neither a '1' nor a '0' is driven to the plurality of OCDs. In other words, each of the NFETs 243 and 247 and the PFETs 241 and 245 of each OCD 210A and 210B may be open. Current may be forced up through the pull-down (PD) driver 225 to the IREF test pad 212, passed through the pass gates 203 and 205, and mirrored to the NFETs 243 and 247 of each OCD 210A and 210B, thereby turning the OCDs/the NFETs 243 and 247 on.

In an embodiment, the PFETs (pull-up (PU) drivers) 241 and 245 are turned on by a Vcc, thereby creating a voltage drop across the PFETs 241 and 245. The voltage drop across the PFETs 241 and 245 may cause a voltage to develop on the TSV nodes 264 and 268 of each respective OCD 210A and 210B. The voltage at the TSV nodes 264 and 268 also may be fed to the positive input of each Test IB 213 and 215. The VREF test pad 242 may provide a reference voltage to the negative input of each IB 213 and 215, such that a voltage comparison can be made. The voltage applied to the VREF test pad 242 may be chosen to verify that the PFET impedance is within a predetermined specification range.

Each Test IB 213 and 215 may be configured to output a '0' or a '1' based on the input voltage at the positive and negative inputs of the IBs 213 and 215. The output from the test IBs 213 and 215 may indicate whether or not the corresponding OCD 210A and 210B operates within the predetermined specification threshold and therefore, whether each corresponding OCD 210A and 210B passes or fails. The test IBs 213 and 215 may be configured such that a '0' may represent a pass or a fail based on, among other things, the value of the reference voltage (i.e. the voltage applied to VREF test pad 232) and the impedance value being tested. The same may apply for a logic output '1' from the test IBs 213 and 215. In another embodiment of the circuit 200, it may be possible to test for both a minimum and a maximum impedance of a PFET, such that the impedance of the PFET within a desired impedance range may be verified. Testing both the minimum and the maximum impedance of PFET may comprise performing two distinct voltage comparisons (where the first voltage comparison comprises testing for a minimum impedance and the second voltage comparison comprises testing for a maximum impedance). The scan chain 217 may be configured to lock in the results from each Test IB 213 and 215 according to the clock signal CLK, and the results may be sent to the Scan out test pad 232. By clocking the scan chain 217, the results may be tied to clock cycles and a designer can determine which of the plurality of OCDs 210A and 210B have passed and which have failed the tests.

Figure 3:
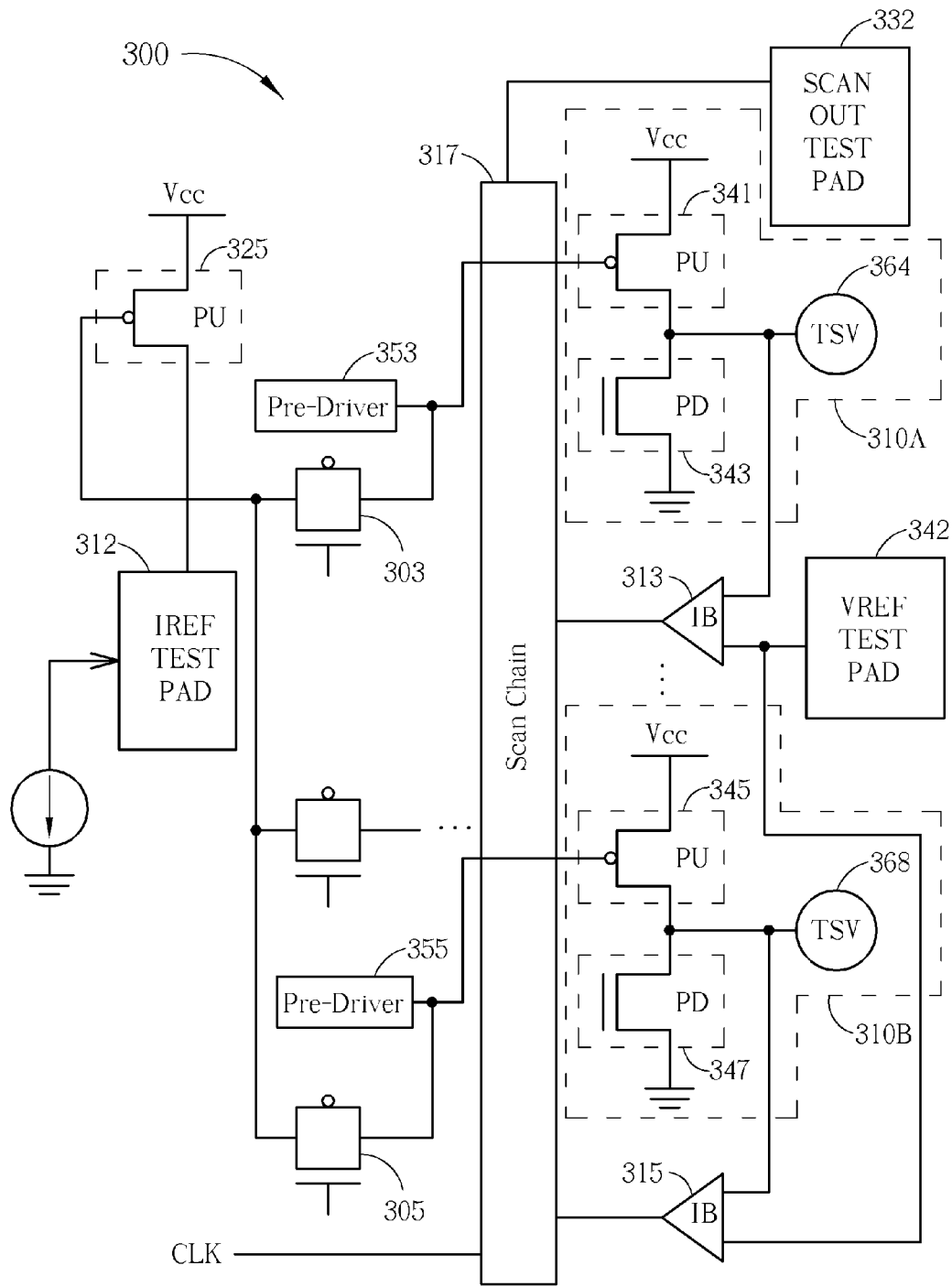
FIG. 3 is a diagram of an off-chip driver comprising through-silicon vias according to another embodiment of the present application.

FIG. 3 illustrates an exemplary embodiment of a circuit 300 according to the present application. The structure and/or operation of the circuit 300 should be readily apparent to one skilled in the art in light of the above description of FIG. 2. In an embodiment, circuit 300 comprises a plurality of OCDs 310A and 310B. While FIG. 3 only illustrates two OCDs 310A and 310B, the number of OCDs supported by the current application is not limited. Each OCD 310A and 310B comprises a pull-up driver (PU) 341 and 345 coupled to a pull-down driver (PD) 343 and 347. Each OCD 310A and 310B is coupled, via pre-drivers 353 and 355, to a pass gate 303 and 305, respectively. The output voltage node of each respective OCD 310A and 310B is coupled to a TSV 364 and 368, and also to the positive input of a Test Input Buffer (IB) 313 and 315. The negative input of each Test IB 313 and 315 is coupled to a VREF test pad 342. Each Test IB 313 and 315 outputs a comparison result to a scan chain 317, which is clocked by a clock signal CLK, and the 'scan out' results are input to a Scan out test pad 332. The pass gates 303 and 305 of each respective OCD 310A and 310B are coupled to a pull-up driver 325 which acts to force current to the IREF test pad 312, and this current is mirrored to the PFETs (pull-up drivers) 341 and 345 of the OCDs 310A and 310B. When the NFETs (pull-down drivers) 343 and 347 are turned on, a voltage drop (Vdrop) develops across the NFETs 343 and 347. A corresponding voltage at the TSVs 364 and 368, Vtsv, is then fed into the positive input of the corresponding Test IBs 313 and 315. In an embodiment, the VREF test pad 342 is configured to receive a reference voltage and transmit the reference voltage to the negative input of the Test IBs 313 and 315, and the output from the test IBs 313 and 314 will be input to the scan chain 317 and then on to the Scan out test pad 332.

FIG. 3 illustrates an embodiment of a testing circuit 300 for testing impedance of a pull-down driver (e.g. 343 and 347) of an OCD 310A and 310B. One difference between FIG. 2 and FIG. 3 is that the circuit 200 uses an NFET 225 to force current through the IREF test pad 212, and this current is then mirrored via the pass gates 203 and 205 to the off-chip drivers for which pull-up impedance is to be tested The circuit 300 illustrated in FIG. 3 uses a pull-up driver (PFET) 325 to force current through the IREF test pad 312, and the current is then mirrored via the pass gates 303 and 305 to the off-chip drivers for which pull-down impedance is to be tested.

The following two examples illustrate the selection of the reference voltage value according to an embodiment. As discussed above, a designer may choose, among other things, an "acceptable" impedance range for the purposes of OCD testing. While the following examples are described in reference to the circuit 200, in light of the current application, one skilled in the art can readily ascertain how to apply the method in relation to embodiments encompassed by the description of FIG. 3 and the circuit 300. The numbers and values used are provided for illustrative purposes and are not to be taken in a limiting sense. In practical terms, the actual numbers and values may be different.

Testing Maximum Impedance

For the following example, reference is made to FIG. 2 and OCD 210A. Assume that Vcc is about 1V and a current of about 1 mA is forced through the IREF test pad 212. In an embodiment, the maximum impedance across the PFET 241 may be chosen/dictated by practical considerations to be about 100Ω. As discussed above, the current of 1 mA from the IREF test pad 212 is mirrored through the PFET 241 such that a voltage drop Vdrop develops, a voltage Vtsv will develop on the through-silicon via 264, wherein Vtsv is equal to the supply voltage (Vcc) minus the voltage drop (Vdrop). This relationship is represented by Equation (1):

$$Vtsv = Vcc - Vdrop \quad (1)$$

Calculating using the values proposed above:

$$Vtsv = 1V - (1\ mA * 100\Omega)$$

Therefore, Vtsv=0.9V

In this example, Vref should be selected to be about 0.9V. If the PFET 241 exceeds its maximum impedance then Vdrop will increase, and Vtsv will consequently be lower than 0.9V. The Test IB 213 will therefore output a '0' if the comparison result indicates that Vtsv<Vref, which indicates, in this embodiment, that the OCD fails.

Testing Minimum Impedance

Again, assume that Vcc is about 1V and a current of about 1 mA is forced through the IREF test pad 212. In this example, the minimum impedance across the PFET 241 may be chosen/dictated by practical considerations to be about 100Ω. Applying these same values into Equation (1) gives a reference voltage of 0.9V; if the impedance of the PFET 241 is less than about 100Ω, then Vtsv will exceed 0.9V. Therefore, when testing for minimum impedance, if Vtsv>Vref, the Test IB 213 will output a '1' which indicates, according to one embodiment, that the OCD fails.

Please note that the above two examples assume that the NFET 243 of the OCD is functioning correctly. As demonstrated by these examples, it is possible to test for both minimum and maximum impedance of the PFET of an OCD (or the NFET, with suitable modifications) utilizing the same circuit. Therefore, according to the present application, OCDs can be tested quickly and efficiently to ensure they operate within a particular impedance range.

According to the present application, if a designer wishes to add more OCDs to a testing circuit, an additional single pass gate (e.g., 203 or 205) and Test IB (e.g. 213 or 215) for each OCD to be tested may be added. It is possible to test either the NFET or the PFET of each OCD by altering the forced current that is input to the pass gates, i.e. by utilizing a pull-up driver instead of a pull-down driver, or vice versa. In addition, a designer can select the value of the voltage reference input to the negative input of the Test IB, such that any range of impedance can be tested. Therefore, the testing circuit of the present invention provides excellent test coverage for measuring impedance of a plurality of OCDs without introducing large amounts of capacitance to the system.

Advantageously, a testing circuit (e.g. 200) according to the present application may be configured to test a plurality of OCDs (e.g. 210A and 210B) without having to probe each respective through-silicon via and deal with the physical challenges associated therewith. Another advantage of the present application is the ability to test the qualitative compliance of a plurality of OCDs without adding relatively large metal capacitances to the OCD.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims and equivalents thereof.

What is claimed is:

1. A testing circuit comprising:
   a plurality of off-chip drivers (OCD), each off-chip driver comprising:
      a pull-up driver coupled to a power supply;
      a pull-down driver coupled between the pull-up driver and ground; and
      a through-silicon via (TSV), coupled between the pull-up driver and the pull-down driver;
   a plurality of pre-drivers, each pre-driver of the plurality of pre-drivers respectively coupled to one of the plurality of off-chip drivers;
   an IREF test pad coupled to the plurality of pre-drivers;
   a plurality of input buffers (IB), each of the plurality of input buffers comprising a positive input and a negative input, wherein the positive input of each of the plurality of input buffers is respectively coupled to one of the plurality of off-chip drivers through the through-silicon via of each respective off-chip driver;
   a VREF test pad coupled to the negative input of each of the plurality of input buffers; and
   a scan out test pad, coupled to the plurality of input buffers.

2. The testing circuit of claim 1, further comprising:
   a plurality of pass gates wherein each respective pass gate is coupled to at least one of the plurality of pre-drivers.

3. The testing circuit of claim 2, further comprising:
   an IREF pull-up driver coupled to the IREF test pad, and the plurality of pass gates.

4. The testing circuit of claim 2, further comprising:
   an IREF pull-down driver coupled to the IREF test pad, and the plurality of pass gates.

5. The testing circuit of claim 1, further comprising:
   a scan chain, coupled between the plurality of IBs and the scan out test pad, the scan chain being further coupled to a clock input.

6. The testing circuit of claim 5, wherein the scan chain is configured to transmit an output to the scan out test pad.

7. A method for verifying an impedance of a plurality of off-chip drivers, the method comprising:
   driving a current to the plurality of off-chip drivers, wherein each off-chip driver comprises:
      a pull-up driver coupled to a power supply;
      a pull-down driver coupled between the pull-up driver and ground; and
      a through-silicon via (TSV), coupled between the pull-up driver and the pull-down driver;
   turning on the plurality of off-chip drivers, wherein each respective off-chip driver is coupled to at least one of a plurality of pre-drivers, and further wherein turning on the plurality of off-chip drivers creates a voltage drop at each TSV;
   receiving a reference voltage at a plurality of input buffers (IB), wherein each of the plurality of input buffers comprises a plurality of inputs, wherein each of the plurality of input buffers is configured to compare the plurality of inputs and output a comparison result;

comparing, in each of the plurality of input buffers, the reference voltage and the voltage at the TSV of one of the off-chip drivers; and verifying the impedance of each of the plurality of OCDs using the comparison result of each of the plurality of input buffers to determine whether the impedance of each OCD is within a desired range.

8. The method of claim 7, wherein the step of receiving the reference voltage comprises receiving the reference voltage from a VREF test pad.

9. The method of claim 7, wherein the step of driving a current to the plurality of off-chip drivers further comprises:

mirroring the current to drive a mirrored current to the plurality of OCDs.

10. The method of claim 9, wherein the step of driving a current to a plurality of off-chip drivers further comprises:

driving the current through a pull-up driver and an IREF test pad; and driving the mirrored current comprises:

driving the mirrored current to each respective pull-up driver of each of the plurality of OCDs.

11. The method of claim 9, wherein the step of driving a current to a plurality of off-chip drivers further comprises:

driving the current through a pull-down driver and an IREF test pad; and driving the mirrored current comprises:

driving the mirrored current to each respective pull-down driver of each of the plurality of OCDs.

12. The method of claim 7, wherein the step of verifying the impedance of each of the plurality of OCDs further comprises:

transmitting the comparison results to a scan chain;

receiving a clock signal at the scan chain, wherein the scan chain is configured to store the plurality of comparison results sequentially; and transmitting the stored sequential results to an output.

13. The method of claim 7, further comprising:

using the comparison result of each of the plurality of input buffers to verify a minimum and a maximum impedance of each of the plurality of OCDs.

* * * * *